(12) United States Patent
González et al.

(10) Patent No.: US 11,355,912 B2
(45) Date of Patent: Jun. 7, 2022

(54) METHOD AND DEVICE FOR DETECTING FAULTS IN TRANSMISSION AND DISTRIBUTION SYSTEMS

(71) Applicant: Universidad Pontificia Bolivariana, Medellín (CO)

(72) Inventors: Jorge Wilson González, Medellín (CO); Hugo Alberto Cardona, Medellín (CO); Idi Amin Isaac Millán, Medellín (CO); Gabriel Jaime López, Medellín (CO); Jairo Augusto Lopera, Medellín (CO)

(73) Assignee: Universidad Pontificia Bolivariana, Medellin (CO)

( * ) Notice: Subject to any disclaimer, the term of this patent is extended or adjusted under 35 U.S.C. 154(b) by 684 days.

(21) Appl. No.: 16/306,521

(22) PCT Filed: Jun. 1, 2017

(86) PCT No.: PCT/IB2017/053259
§ 371 (c)(1),
(2) Date: Feb. 28, 2019

(87) PCT Pub. No.: WO2017/208197
PCT Pub. Date: Dec. 7, 2017

(65) Prior Publication Data
US 2019/0187201 A1    Jun. 20, 2019

(30) Foreign Application Priority Data

Jun. 1, 2016  (CO) .................................. 16-144247

(51) Int. Cl.
*H02H 3/08*    (2006.01)
*G01R 31/00*   (2006.01)
(Continued)

(52) U.S. Cl.
CPC ........... *H02H 3/08* (2013.01); *G01R 19/0038* (2013.01); *G01R 31/00* (2013.01); *H02H 1/00* (2013.01); *H02M 1/32* (2013.01); *H02M 5/4505* (2013.01)

(58) Field of Classification Search
CPC ................ G01R 19/10; G01R 19/0095; G01R 19/0038; G01R 19/2513; G01R 19/16547;
(Continued)

(56) References Cited

U.S. PATENT DOCUMENTS 4,851,782 A    7/1989  Jeerings et al.
5,537,327 A    7/1996  Snow et al.
(Continued)

FOREIGN PATENT DOCUMENTS

EP    2299568 A1    3/2011
WO    2013184332 A1    12/2013

OTHER PUBLICATIONS

Mejia Villegas, Subestaciones de alta y extra alta tensión, book chapter, 2003, pp. 601-602, second edition, HMV ingenieros, Medellín, Colombia.

*Primary Examiner* — Alvaro E Fortich
*Assistant Examiner* — Dustin R Dickinson
(74) *Attorney, Agent, or Firm* — The Morales Law Firm; Joseph L. Morales

(57) ABSTRACT

The present invention corresponds to a method and an apparatus for detecting faults in transmission and distribution systems. The method is characterized by the steps of: a) Rectifying the ac current signal of the "auxiliary services" triphasic system; b) Rectifying and inverting the ac current signal of the transmission and distribution system; c) Connecting the step b signal to step a signal; d) Measuring the ac current signal obtained in step b; e) Measuring the dc current signal rectified in step a; f) Scaling the value of the
(Continued)

current measured in step e by a scale k factor; g) Calculating the rms value of the signal measured in step d; h) Finding the difference between the values obtained in steps f and g; i) Comparing the absolute value of the step h difference with a reference value m; j) If the comparison made in step i is greater than the reference value m, a trigger signal is generated and the tension is maintained between the dc points of step b in about from 0 to 90%, of the operating tension with no fault. The apparatus comprises, a rectifier; an inverter connected to the rectifier; current measuring means at the rectifier and inverter outlets; and a control unit connected with the rectifier, the inverter and the current measuring means that makes the tripping command of the rectifier and the inverter, and compares the dc current measure at the rectifier outlet with the inverter outlet current, sending a tripping signal according to said comparison.

10 Claims, 12 Drawing Sheets

(51) Int. Cl.
*H02H 1/00* (2006.01)
*H02M 1/32* (2007.01)
*G01R 19/00* (2006.01)
*H02M 5/45* (2006.01)

(58) Field of Classification Search
CPC ........ G01R 31/00; G01R 31/42; G01R 31/40; G01R 31/343; G01R 31/086; H02M 1/0009; H02M 1/32; H02M 1/325; H02M 1/4216; H02M 5/4585; H02H 3/08; H02H 1/00
See application file for complete search history.

(56) References Cited

U.S. PATENT DOCUMENTS

| | | |
|---|---|---|
| 5,550,751 A | 8/1996 | Russell |
| 8,964,423 B2 | 2/2015 | Anghel |
| 2010/0066551 A1* | 3/2010 | Bailey ................. G01R 31/343 340/648 |
| 2012/0032617 A1* | 2/2012 | Jones ..................... H02P 23/06 318/51 |
| 2018/0159421 A1* | 6/2018 | Zhang ................ H02M 7/7575 |

* cited by examiner

METHOD AND DEVICE FOR DETECTING FAULTS IN TRANSMISSION AND DISTRIBUTION SYSTEMS

FIELD OF THE INVENTION

The present invention is related with the method and apparatus for detecting faults in transmission and distribution systems, more particularly, to a method and apparatus for detecting the Monophasic fault in Transmission Line and Substation, Biphasic in Substation and Triphasic in transmission Line and Substation.

DESCRIPTION OF THE PRIOR ART

In the electrical power generation and distribution industry the fault detection and the fault conditions, in transmission and distribution systems is very important. Given that the fault conditions often represents danger for persons, goods, and waste electrical energy.

The purpose of detecting faults in transmission and distribution systems is to prevent the propagation of damages such as, for example: damage to persons, animals and the environment, as well as to equipment in the substations and transmission lines, another purpose is to avoid costs and blackouts.

This type of faults are of various types as for example those indicated in in Mejia Villegas S. A. document (2003). High and Extra High Voltage Substations (Second ed.) HMV ENGINEERS, wherein are reported faults as Monophasic, Biphasic and Triphasic faults. It is further reported the existence of faults directly associated with the activation of the protections in normal and abnormal conditions.

There are hardly detectable faults by the protection apparatus available today, one such condition is the impedance fault, which is generally caused by poles being dawned, fallen tree branches in the conductors, among other causes.

In the prior art are reported method and apparatus for the fault detection in an electrical power system as for instance in U.S. Pat. No. 5,550,751 A which discloses an expert system for the detection of high impedance faults occurring in electrical cables.

The prior art further discloses methods for detecting faults as U.S. Pat. No. 4,851,782 A which discloses a method for detecting faults based on the detection of harmonic currents generated by the high impedance arc fault behavior.

The prior art discloses methods requiring mathematical processes as for instance complex calculations such as Fourier Transforms and derivative calculations in order to determine if what is occurring is really a fault, an example of this is U.S. Pat. No. 5,537,327 A which discloses that even though this process is made at a very high speed given the modern electronic, it is evident that are made a series of actions before taking the final decision (to operate or not to operate) which represent a disadvantage.

Furthermore imported fault protection and detection systems in the prior art are based on the in measuring and regulating the current and the tension in which the high tension current transformers are used, allowing to obtain the desired signals with a relatively low magnitude so that it can be measured by the analog and digital devises without suffering any damages, these high tension current transformers are costly equipment that actually are necessary for detecting faults and that can lead to saturation errors.

Therefore, there is the need for a method and apparatus for fault detecting in electrical transmission and distribution systems that avoid the use of high tension current transformers and that shorten the decision taking chain, by not using complex calculations such as for example the Fourier Transform or derivative calculations that can be complementary used with the protection systems as for example are the protective relays.

SUMMARY OF THE INVENTION

The present invention corresponds to a method and an apparatus for detecting faults in the transmission and distribution systems.

In order to understand the present invention it will be understood by triphasic system of auxiliary services those systems that guarantee the continuous supply of the electrical energy for operating and supporting the main or primary equipment of an electrical substation. It will also be taken by a transmission or distribution system that triphasic electrical system for energy transmission with transmission and distribution tension values, through which the electrical energy goes from a point to another.

The method for detecting faults in transmission and distribution systems is characterized by the following steps:
a. Rectifying the ac current signal of the "auxiliary services" triphasic system;
b. Rectifying and inverting the ac current signal of the transmission and distribution system;
c. Connecting the step b signal to step a signal;
d. Measuring the ac current signal obtained in step b;
e. Measuring the dc current signal rectified in step a;
f. Scaling the value of the current measured in step e by a scale k factor;
g. Calculating the rms value of the signal measured in step d;
h. Finding the difference between the values obtained in steps f and g;
i. Comparing the absolute value of the step h difference with a reference value m;
j. If the comparison made in step i is greater than the reference value m, a trigger signal is generated and the tension is maintained between the dc points of step b in about from 0 to 90%, "preferably 40%" of the operating tension with no fault.

The fault detecting apparatus in a transmission and distribution systems implemented by the hereinabove described method, comprises:
a. An "auxiliary services" triphasic system;
b. A rectifier connected to the "auxiliary services" triphasic system;
c. An inverter connected to the rectifier;
d. A transmission and distribution system connected to the inverter;
e. Measure means of the current connected to the rectifier outlet and to the inverter outlet;
f. A control unit.

The control unit gives the trigger command of the rectifier and the inverter and compares the dc current measure at the rectifier outlet with the current at the inverter outlet, sending a triggering signal according to that comparison.

Some of the faults detected by the invention, but not limited to these, are described in the following table:

| Type of fault | Location | Description |
|---|---|---|
| Monophasic | Substations and transmission and distribution lines | This type of faults can be, solid, when the phase contact is direct to ground (i.e., |

-continued

| Type of fault | Location | Description |
|---|---|---|
| | | dropping of a line), or of high impedance, when the contact with ground is through a element different to the phase (i.e., trees, vegetation or animals). |
| Biphasic | Substations and transmission and distribution lines | Fault produced by the contact or dropping to ground of two phases or transmission lines. If it is caused by dropping, the fault is called biphasic to ground, is it is by contact can be directly between the lines or phases or by means of an external element to the electrical network. |
| Triphasic | Substations and transmission and distribution lines | A fault caused by the contact between the three phases of the electrical line or by the dropping and contact to ground of the three phases of the network. |

DETAILED DESCRIPTION OF THE INVENTION

The present invention corresponds to a method and apparatus for detecting faults in transmission and distribution systems.

The fault detection method in transmission and distribution systems is characterized by the following steps:
a. Rectifying the ac current signal of the "auxiliary services" triphasic system;
b. Rectifying and inverting the ac current signal of the transmission and distribution system;
c. Connecting the step b signal to step a signal;
d. Measuring the ac current signal obtained in step b;
e. Measuring the dc current signal rectified in step a;
f. Scaling the value of the current measured in step e by a scale k factor;
g. Calculating the rms value of the signal measured in step d;
h. Finding the difference between the values obtained in steps f and g;
i. Comparing the absolute value of the step h difference with a reference value m;
j. If the comparison made in step i is greater than the reference value m, a trigger signal is generated and the tension is maintained between the dc points of step b in about from 0 to 90%, "preferably 40%" of the operating tension with no fault.

Step a: Rectifying the ac current signal of the "auxiliary services" triphasic system; is carried out to obtain a direct current controlled by a rectifier current control.

The fault detection method in transmission and distribution systems is carried out by two controls, the rectifier current control and the inverter current control, these controls will be explained later in the sections of the rectifier current, and the inverter current.

The steps f to j and the rectifier current control and the inverter current control implementation are carried out in a control unit, for example a processor, a microprocessor, an industrial computer, etc.

In the control unit during step j, if the comparison made in step I is greater than a reference value m, generally selected by a human operator, it generates a tripping signal and increases the tension between 0 and a 3% in the direct signal of step a.

The reference value m is between 0.005 and 0.05. The tripping signal (Trip), is a signal used to perform different actions as for example to activate alarms of the fault occurrence and to activate or deactivate equipment, protections, etc.

Rectifier Current Control

Figure 1:
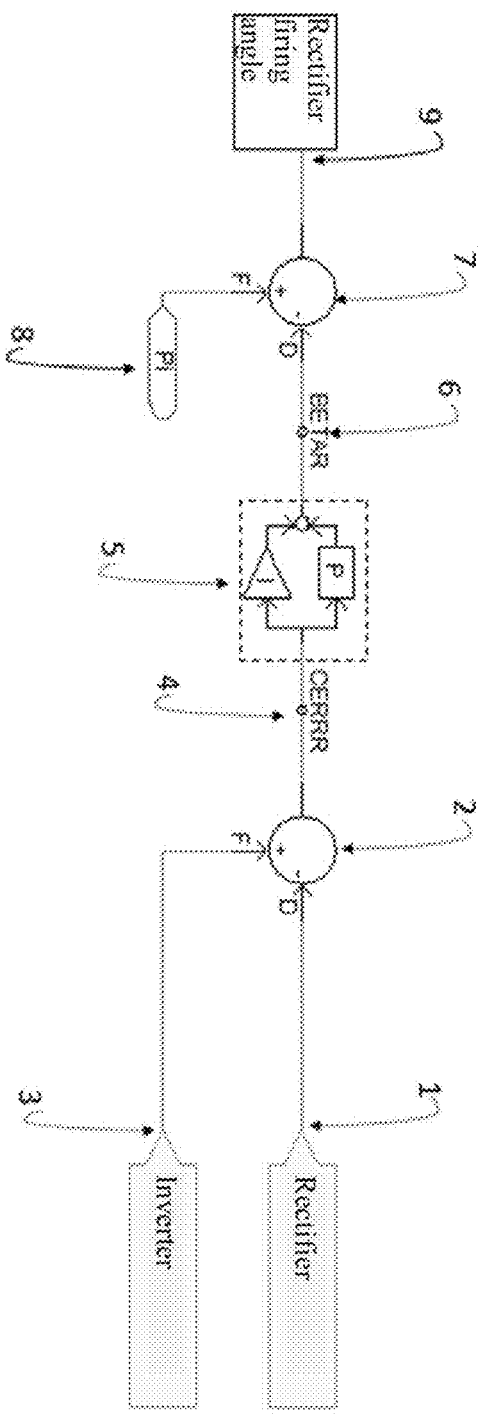
FIG. 1 shows a block diagram of the Rectifier Control.

Referring to FIG. 1, it shows a step a rectifier control, of the fault detecting transmission and distribution systems, wherein it is taken (I) the step a rectified current signal, it is compared (2) with the step b rectified signal (3) and the CERRR (4) result is entered to an integral proportional control PI (5) governed by the following transference equation:

$$u(t) = K_p e(t) + \frac{K_p}{T_i} \int_0^t e(\tau) d\tau$$

At the outlet of this transference function is obtained a current signal corresponding to a BETAR angle (6) which is subtracted (7) with a π angle (7), the result corresponds to the rectifier triggering angle (9).

For a particular example of the rectifier current control the values of the integral proportional control transference function are given by:
$K_p$=Gain, system parameter, 1.0989
G=system parameter
$T_i$=0.01092 s
Initial signal of the integrated=1.57
e(t)=CERRR. Error between the rectifier measurement and the inverter controls based on external command or inverter measurements.
u(t)=BETAR The rectifier control is regulated from the current measured in the side of the inverter system, so there is a constant monitoring of this parameter by the rectifier control.

To carry out step b, rectifying and inverting the ca current signal, of the transmission and distribution system in the fault detecting method in transmission and distribution systems is carried out an inverter current control.

Inverter Current Control

Figure 2:
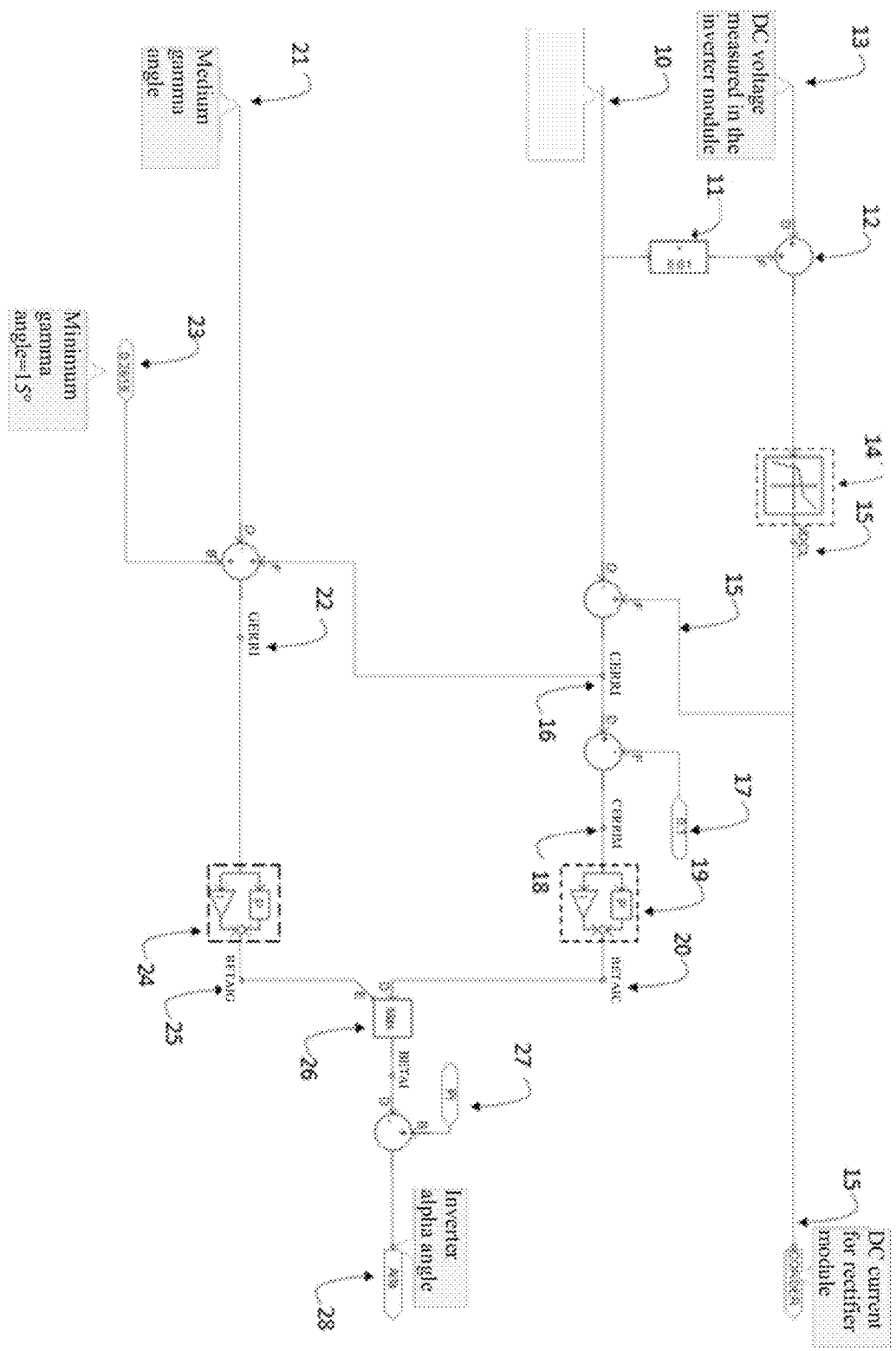
FIG. 2 shows a block diagram of the Inverter Control.

Referring to FIG. 2, it is shown an step b rectifier and inverter control, from where the inverter current signal from step e (10) is taken and multiplied by a 0.01 factor (11), subsequently is added (12) to the step e inverter tension signal measurement (13) and the result is entered to a generic transference function (14) commanded by the following equation:

$$H(s) = \frac{Y(s)}{X(s)}$$

For a given example the values of this generic transference function (14) are:
Lower inlet=0.4
Lower outlet=0.55
Upper inlet=0.9
Upper outlet=1.0

At this generic transference function outlet (14) is obtained a current signal corresponding to a VDCL variable (15). This signal is a current limit depending of the tension and corresponding also to a CORDER outlet current signal (15), used for the rectifier control functions.

The tension into current converting technique is known as the current command limit depending on the voltage by the letters VDCOL and its purpose is to prevent a reactive power demand excess in case of a tension reduction, reducing the current.

From the step b inverter and rectifier controls, is taken the inverted current signal measure in step e (10) and it is subtracted to the CRODER signal (15), from which it is obtained the CERRI signal (16), to which is subtracted a 0.1 factor (17) resulting the CERRIM signal (18) which is entered to an integral proportional control PI (19) commanded by the following transference equation:

$$u(t) = K_p e(t) + \frac{K_p}{T_i} \int_0^t e(\tau) d\tau$$

For a given example the values of the integral proportional equation PI (19) are:
$K_p$=Proportional gain, 0.63
$T_i$=0.01524 s
Upper limit=1.92
Lower limit=0.52
Integrated initial outlet=1.92
e(t)=CERRRIM (18)
u(t)=BETAIC (19)

At the transference function outlet is obtained a current signal corresponding to a BETAIC angle (20).

The gamma angle measured (20) in the inverter is subtracted to the sum of angles CERRI (22) and the minimum gamma angle is 0.2618, and the GERRI result (23) is entered to an integral proportional control PI (24) commanded by the following transference equation:

$$u(t) = K_p e(t) + \frac{K_p}{T_i} \int_0^t e(\tau) d\tau$$

For a given example the values of the integral proportional equation PI (24) are:
$K_p$=Proportional gain, 0.63
$T_i$=0.01524 s
Upper limit=1.92
Lower limit=0.52
Integrated initial outlet=1.92
e(t)=GERRI
u(t)=BETAIC At the transference function outlet is obtained a BETIG angle, which is compared with the BETAIG signal (25) and to the maximum value between these two (26) is subtracted the π angle (27), the result corresponds to the alpha inverter rectifier trip (28).

Fault Detecting Apparatus

The fault detecting apparatus in transmission and distribution systems herein described is implemented in a fault detection devise in transmission and distribution systems corresponding to:
a. An "auxiliary services" triphasic system;
b. A rectifier connected to the "auxiliary services" triphasic system;
c. An inverter connected to the rectifier;
d. A transmission and distribution system connected to the inverter;
e. Measure means of the current connected to the rectifier outlet and to the inverter outlet;
f. A control unit.

Wherein the control unit produces the tripping command of the rectifier and inverter, and compares the dc current measurement at the rectifier outlet with the inverter outlet current, sending a tripping signal according to the comparison.

The rectifier is elected from rectifying bridges for example of 6 to 12 pulses, wherein each pulse corresponds to the number of thyristors using the rectifier bridge.

In one embodiment of the rectifier invention there is an uncontrolled triphasic converter bridge.

The thyristors also known as valves, are usually electronic or solid state communication devises and should be understood in the present invention as a wide family of devises that can perform the operations of: relays, solid state relays, contactors, thyratrons, ignitions, rheostats, power transistors, silicon controlled rectifier (SCR by its english letters), starters, breakers, solid state breakers, saturable reactances, magnetic amplifiers, vacuum tubes, thermostats, rotating converters, among others.

The current measurement means connected to the rectifier outlet and the inverter outlet, where step c is carried out, measure the ac current signal obtained in step and the step d measures the rectified dc current in step a of the fault detecting transmission and distribution systems of the present invention.

The control unit is for instance a processor, a microprocessor, a minicontroller, an industrial computer, etc.

In the control unit is carried out the rectifier and inverter current control, as well as steps f to j in transmission and distributions systems previously described.

The control unit generating the tripping signal. The current measurement from step d is rectified with a differential rectifier and subtracted from the half-value measured in step e and then applied to step I and j, method for fault detection in transmission and distribution systems herein described, where in step j, if the comparison made in step I is greater than the reference value m, is generated a tripping signal and increased the tension between 0 and 3%, in the step a direct signal.

Through this process the control unit detects those faults in communication given in the inverter module and being caused, for example, by monophasic or triphasic faults in the transmission and distribution system.

The control unit making the rectifier and inverter tripping command and comparing the dc current measurement at the rectifier outlet with the inverter outlet current, sends a tripping signal according to said comparison. Comparing the absolute values of step h with the m reference value.

In a rectifier current invention control embodiment it is used the constant current or Constant Current Control (CCC) technique. The reference for the current limit is obtained from an inverter connected to the rectifier. This is made for the converter protection in situations when at the side of the inverter there is no dc tension supporting or not having load requirement. The reference current used in the rectifier control depends on the available tension in the inverter side.

The dc current in the rectifier side is measured with current measurement means connected to the rectifier outlet where these measurement means include transductors and filters.

The transistors used in the direct systems need to be exposed to an inverse tension for a sufficient time so they stop conducting and to allow a successful current communication. At the moment of a fault in the transmission and distribution system the tension is interrupted, which leads to the valves do not get that inverse tension that will make them to commute, therefore they will continue conducting and provoking a fault in the commutation.

The fault in the commutation happens when the phase tension corresponding to one of the valves, is distorted or displaced by a fault in the transmission or distribution system so that the tension-time area during the commuting gap is reduced to such level that the commutation cannot be completed, generating a short-circuit in the direct side or commutation fault also known as principle of fault in the commutation.

This principle of fault in the commutation is the one allowing to make the fault detection in the present invention by the control unit that implements the fault detecting method in transmission and distribution systems.

Figure 3:
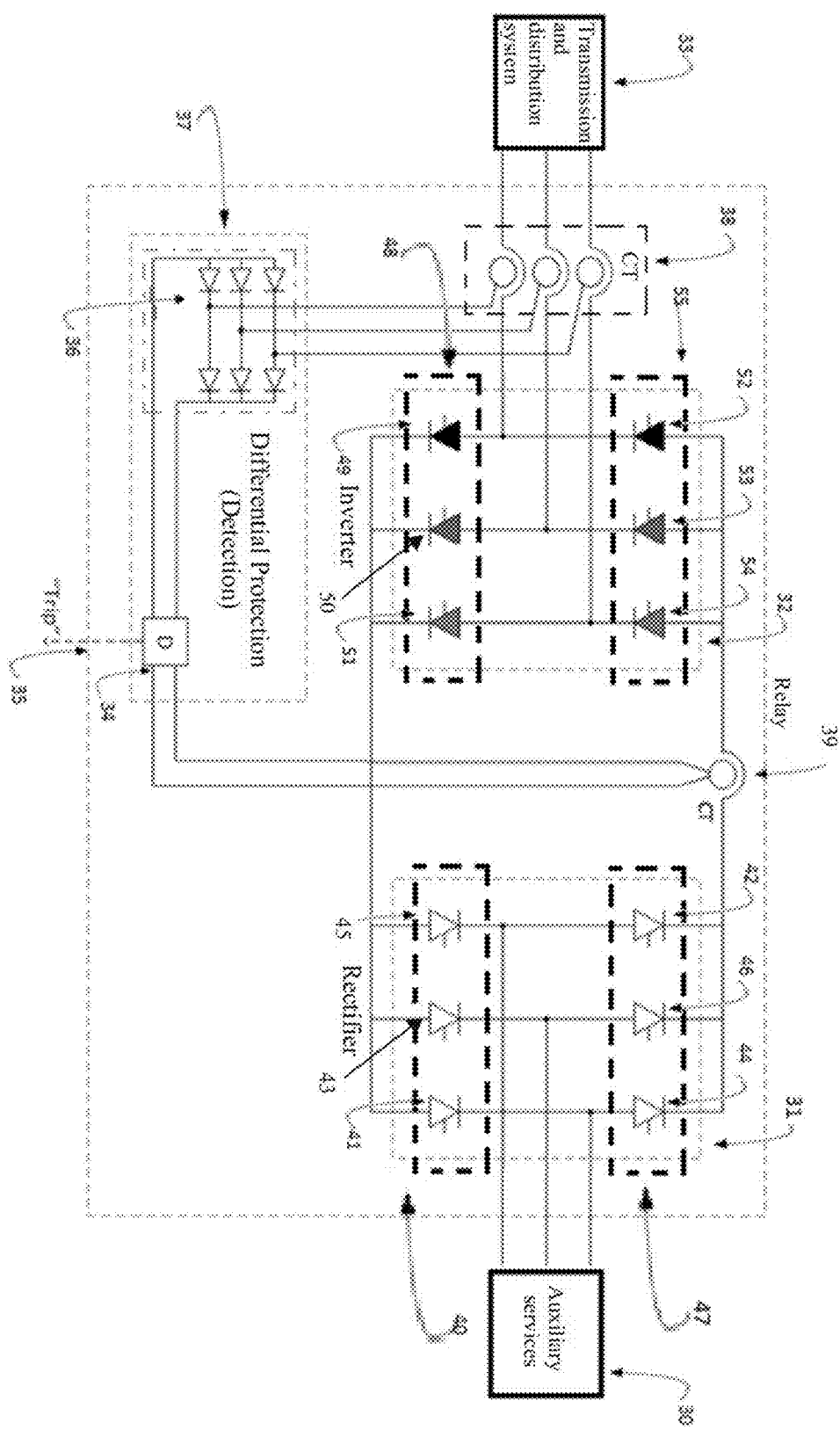
FIG. 3 shows a circuit diagram of an invention apparatus embodiment.

In one embodiment of the invention and referring to the FIG. 3, the fault detecting apparatus in transmission and distribution systems comprises:

a. An "auxiliary services" triphasic system (30);
b. A rectifier (31) connected to the "auxiliary services" triphasic system (30);
c. An inverter (32) connected to the rectifier (31);
d. A transmission and distribution system (33) connected to the inverter (32);
e. Measure means of the current connected to the rectifier outlet and to the inverter outlet;
f. A control unit (34).

Wherein the control unit (33) sends the tripping command of the rectifier (31) and the inverter (32), and compares the dc current measurement at the rectifier outlet with the inverter outlet current, sending a tripping signal (Trip) (35) according to the comparison as indicated in the herein described method.

The rectifier (31) is a triphasic converter bridge of transistors controlled with a tripping angle between 0° and 90°, whose values in operation are preferably found between 15° and 25°.

The inverter (32) is a triphasic converter bridge of transistors controlled with a tripping angle between 90° and 180°.

The means of current measurement means are selected from the group comprising amperimeters, galvanometers, voltmeters, multimeters, meters based on analog and digital converters and hall effect meters, and combination thereof.

In one embodiment of the invention and referring to the FIG. 3, the current measurement means connected to the rectifier outlet (31) and the inverter outlet (33) by a rectifier which is a differential rectifier that is not controlled and is constituted by diodes, from now on this rectifier will be known as uncontrolled differential rectifier (36).

The uncontrolled differential rectifier (36), is constituted by diodes and in some invention embodiments has a current capacity of 1 to 100 times the "auxiliary services" system nominal current (30).

The uncontrolled differential rectifier (36) has a current capacity for instance of 100 to 1 times the auxiliary services system nominal current.

In one embodiment of the invention and referring to the FIG. 3, the connection between the differential protection and the transmission and distribution system is made through the instrumentation transformer (38).

The instrumentation transformers can be; current transformers or CT—by their acronym in english, current transformers, tension or power transformers or TT—by their acronym in english, tension transformers or VT—by their acronym in english, voltage transformers, PT transformers or power transformers—by their acronym in english, Or combinations thereof.

The uncontrolled differential rectifier (36) is part of a differential protection (37) composed by an uncontrolled differential rectifier (36) which rectifies the signal coming from the instrumentation transformer CT (38). The signal rectified by the uncontrolled differential rectifier is sent to the control unit (34), which compares the ac current measurement value of the transmission and distribution system obtained by the measuring transformer CT (39). Rectified by the uncontrolled differential rectifier (36) with the cd current measurement value of the rectifier module (31) scaled by a K scale factor in the control unit (34), the scale factor value is selected by an operator.

The control unit (34) acts as or indicates the fault detecting method in the transmission and distribution systems previously described, mainly in steps f to j.

The transformers (38) and (39) used by the invention are instrumentation transformers, therefore their transforming relation is higher than the conventional transformers, around 1000 to 1.

In an invention embodiment the measuring means connected to the outlet and inlet of the rectifier correspond to instrumentation transformers (38) and (39), which make the measurement of the parameters in relation of 1000 to 1.

Figure 4:
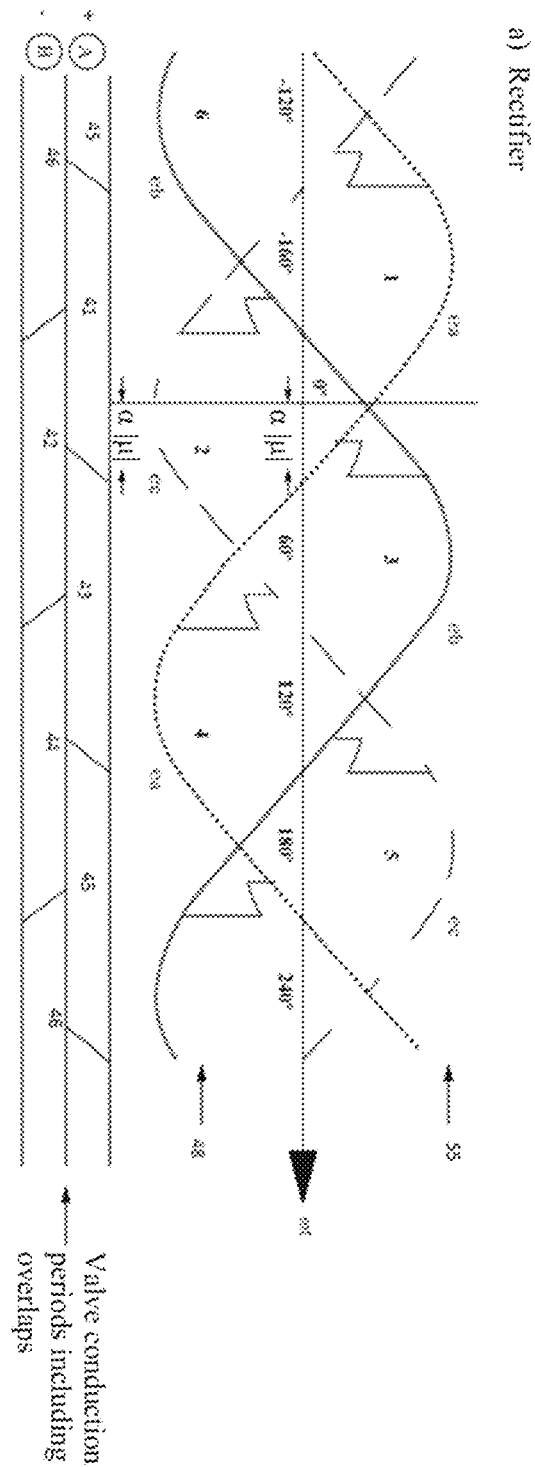
FIG. 4 shows the form of the current signal in the thyristors of a rectifier with six thyristors with no faults.

Example of the rectifier (31) performance without the presence of faults. Referring to FIGS. 3 and 4, the control unit (34) controls the alpha tripping angle ($\alpha$) of the thyristors. The rectifier further has an overlap angle ($\mu$) with operating values between 15 and 25° and not greater than 60° And an extinction angle ($\delta$) corresponding to the sum of angles ($\alpha$) and ($\mu$).

Referring to FIGS. 4 and 3, the current-time signal where wt corresponds to the time angle value. (ea), (eb) and (ec)

correspond to A, B and C phases of the transmission and distribution system. The alpha (a) angle is a rectifier tripping angle and indicates the moment at which the following thyristors stars to commute. The miu (μ) angle is an overlapping angle which indicates the moment at which two thyristors are conducting at the same time.

Figure 5:
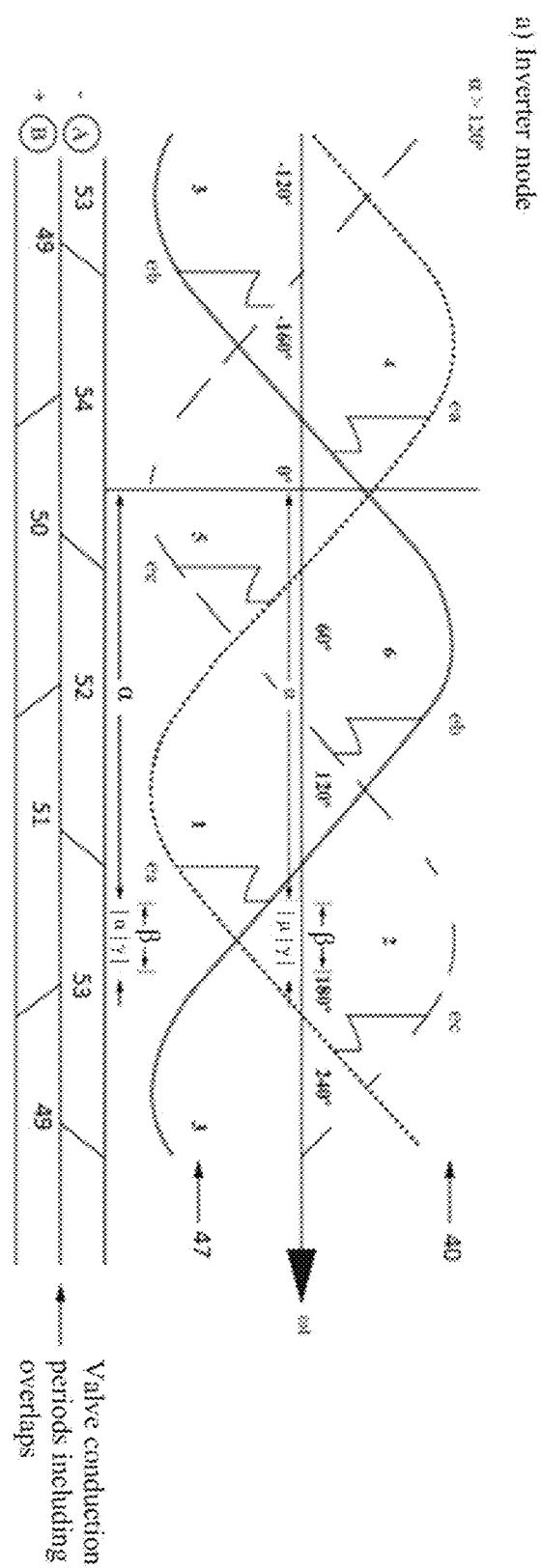
FIG. 5 shows the form of a current signal in the thyristors of a thyristors inverter with no faults.

Referring to FIG. 5, the numeric values of 1, 3, 5 and 6, 2, 4, correspond to conducting periods of the respective thyristors (41), (43), (45) and (46), (42), (44) respectively.

Referring to FIGS. 4 and 3, the conducting period of the thyristors happens in two sequences defining the polarity. The first sequence, usually positive, happens from the file A (40) valve arrangement corresponding to valves (41), (43) and (45), which conduct in positive periods of the ac signal triphasic system when an alpha angle value is reached. The second sequence happens from the file B valve arrangement (47) corresponding to valves (42), (44) and (46) which conduct in the negative periods of the ac signal triphasic system. The conducting period of the valves corresponding to times when the valves are in conductive mode.

The communication of the thyristors is based on the ac tension inversion with dependency upon the alpha tripping angle. The commutation starts by the control unit (34) that removes the thyristors tripping pulse that leaves the conduction and activating the thyristors valve of the same thyristors arrangement entering conduction.

Example of the Inverter (32) Performance without the Presence of Faults.

Referring to FIG. 3. In normal conditions, the fault detecting apparatus starts with the normal operation of the thyristors, where they start sequentially the thyristors (51), (50), (49) and (54), (53) (54), as follows: While valve (52) is conducting, in a certain moment of its conduction time, there is an overlapping between the thyristors (50) and (51), since valve (6) starts the opening process while Valve (51) starts with its closing commutation. When the valve (51) closes, in a moment of its conduction time, there is an overlapping between thyristors (52) and (53), since valve (52) stars with its closing commutation. This process repeats with the remaining thyristors and at the half conduction time of the valve (53), the thyristors (51) and (49) commutate, in a moment of valve (49) conduction time, the thyristors (53) and (54) commutate.

Referring to FIGS. 5 and 3. The inverter (32) rectifies the ac current signal of the "auxiliary services" (30) triphasic system, where the inverter (32) is a triphasic converter bridge of thyristors whose tripping angle is between 90° and 180°. Referring to FIGS. 5 and 3, the rectifier control made by the control unit (34) has as dc tension and current inlet parameters, measured in the inverter and the gamma (γ) extinction angle, measured with normal operating values between 165° (π−15°) and 149° (π−31°). Within the inverter (32) there is another type of angles such as the inverter beta (β) tripping angle related with the rectifier tripping angle as follows pi-alpha (π−α) and the overlapping angle miu (μ) which is equivalent to the relation between the inverter (32) alpha (α) tripping angle and the extinction angle (β−γ).

Referring to FIGS. 5 and 3. It shows a current-time figure where wt corresponds to the angle value along the time. (ea), (eb) and (ec) are respectively the A, B and C phases of the triphasic system of the "auxiliary services" (30). The beta (β) angle corresponds to the tripping angle (analog to the alpha (α) angle in the rectifier) and it indicates the moment at which the thyristors make the overlapping in the conduction periods, between the entering valve and those leaving operation.

Referring to FIG. 5. The numeric values of 1, 3, 5 and 6, 2, 4, correspond to thyristors (52), (53) and (54) and (49), (50 and 51) respectively.

At the inverter side are implemented the gamma extinction angle and the current control. The CCC together with the tension limiter depending of the voltage dependent current order limiter (VDCOL by its english acronym), are used through the PI control. The reference limit for the current control is obtained through external reference comparisons (selected by the operator or the load requirements) and the VDCOL outlet. The measurement error is then subtracted from the reference limit producing the desired angle. The gamma control uses another PI control that produces the gamma angle for the inverter. The two angles are compared and the lower value of them is used for the instant tripping calculation.

Referring to FIGS. 5 and 3. The inverter (32) conduction period is analogue to the described for the rectifier (31), with the difference that the dc tension signal is inverse in the inverter (32) than in the rectifier (31).

Referring to FIGS. 5 and 3. The conduction period of the thyristors is carried out in two sequences defining the polarity. The first sequence is carried out from the valve arrangement in file C (55), corresponding to the valves (52), (53) and (54), which conduct in the ac signal positive periods of the triphasic system when an alpha angle value is reached. The second sequence is carried out from the valve arrangement in file D (48) corresponding to valves (49), (50) and (51). The thyristors conduction period correspond to the times where the thyristors are in conduction.

Example of an Invention Embodiment with Fault Simulation

For carrying out the example is used the Benchmark HVDC model systems of the CIGRE, available in the PSCAD software, which has a control module and an electrical module of the dc system. Using the Benchmark it was implemented a proposed relay design and it was verified its performance before monophasic, biphasic and triphasic faults in a transmission and distribution line and a substation. From the initial Benchmarking model it was eliminated a thyristors bridge of each unit so the system would finally stay at 6 pulses, besides the transformer tension level was adjusted between 120 and 220 V so the dc system would stay at low power. Therefore conforming an apparatus for detecting faults as the described in an invention embodiment where were implemented the faults described next.

Figure 6:
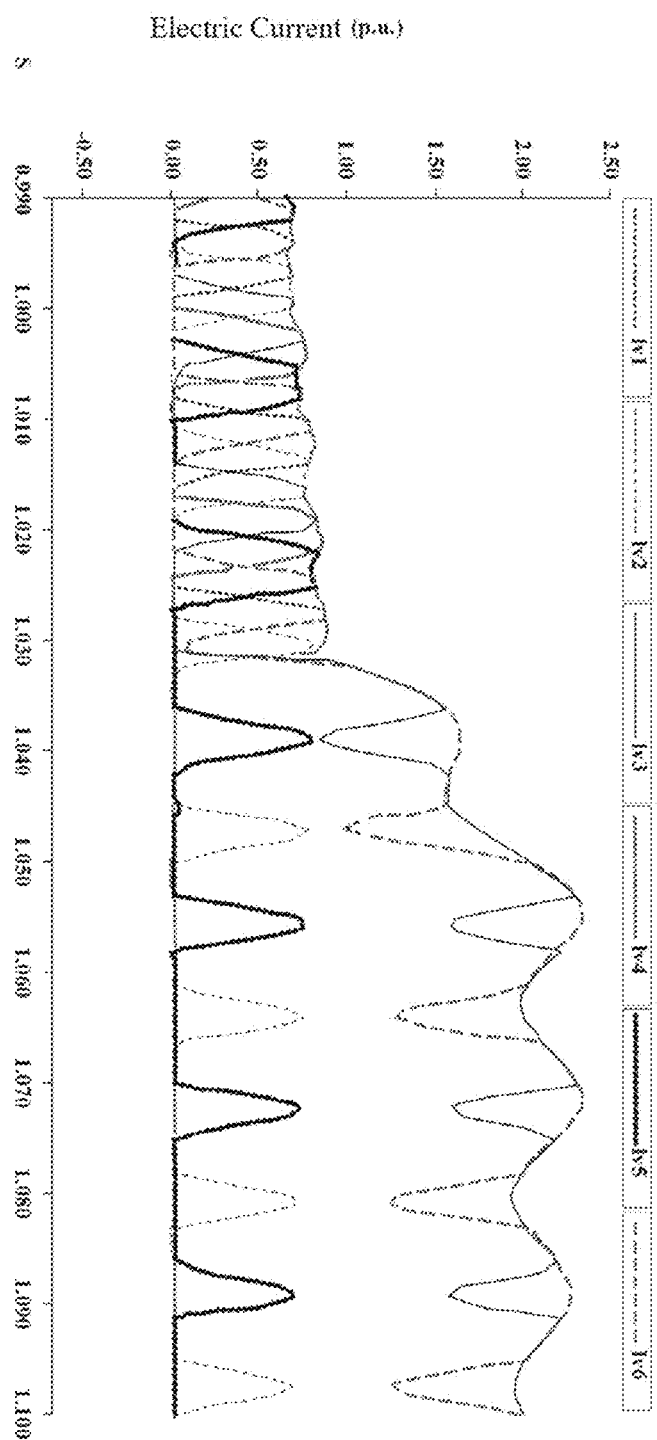
FIG. 6 shows a fault in the transmission line of 100 km with 90Ω impedance fault due to a monophasic short circuit to ground.

Referring to FIGS. 6 and 3. It simulates a monophasic short-circuit to ground with 90 ohm impedance over the transmission system in a 100 km transmission line, when this short-circuit occurs the current signal (Iv2) of thyristors (51) and the inverter (32) does not complete its commutation, generating a commutation fault and thyristors (53) and (50) conduct generating a short-circuit. At this moment the control unit (34) detects the fault and applying the previously described fault detecting method of the present invention it senses the presence of a fault generating a tripping signal (trip) for the breakers of the affected 100 km transmission line.

In steady state or in no-fault state, these herein described currents should be the same or at least with a difference tolerance of, for example, 5%, so it will not be a fault detection by the control, unit (34).

Figure 7:
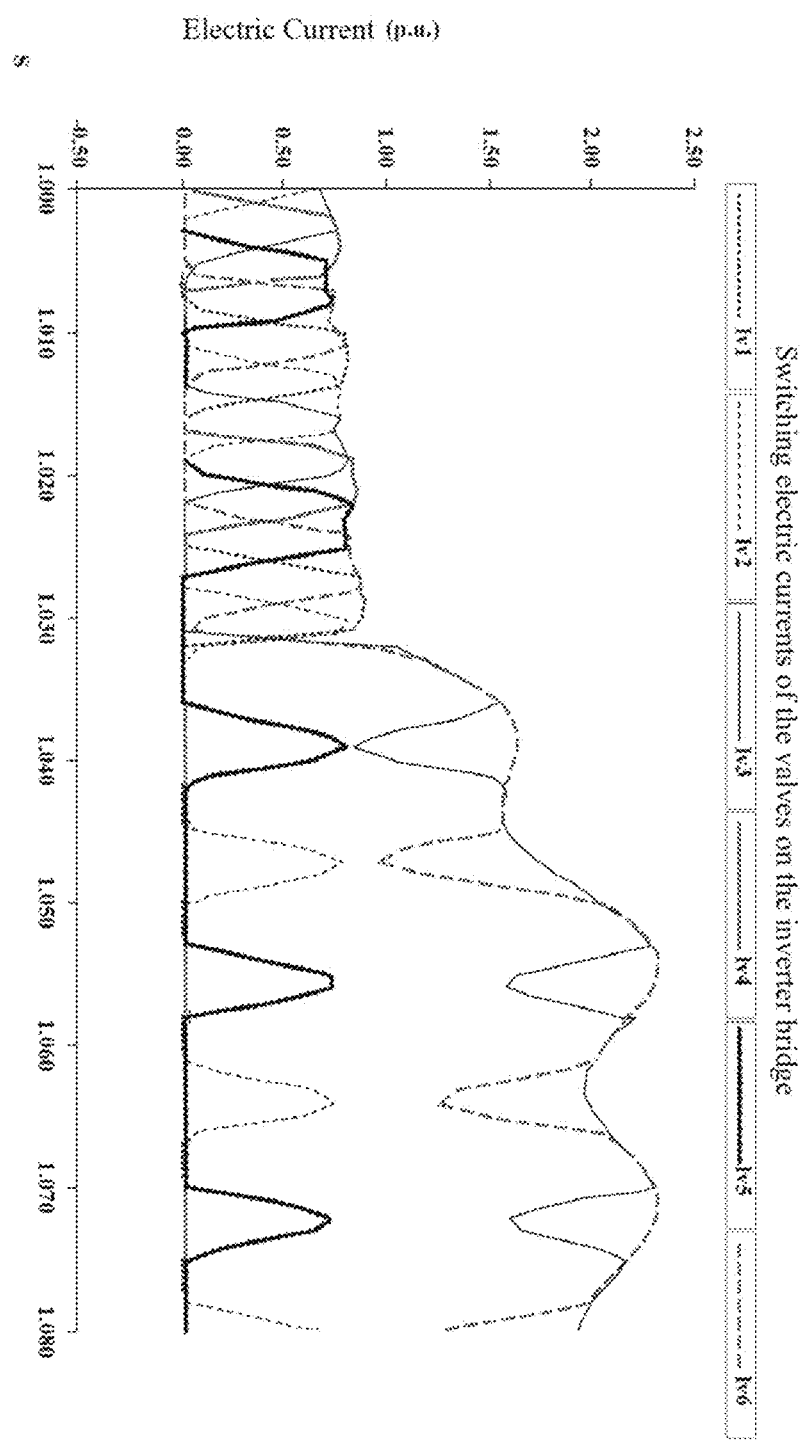
FIG. 7 shows a fault detection example of an invention embodiment caused by a bar failure in a substation with 100 Ω impedance fault.

Referring to FIGS. 7 and 3. It simulates a monophasic short-circuit to ground with 100 ohm impedance over the transmission system and a 100 km transmission line, when occurring this short-circuit the thyristor (51) current (Iv2) does not complete its commutation, showing a commutation fault and thyristors (53) and (50) conduct, generating a short-circuit. At this moment the control unit (34) detects the fault and applying the present invention previously described fault detecting method it detects the fault presence generating a tripping signal for the affected 100 km transmission line breakers. In steady state or in no-fault state, these herein described currents should be the same or its difference will be less to the given adjust of 0.05 A, so it would not exist a tripping signal, nor fault detection by the control unit (34).

Figure 8:
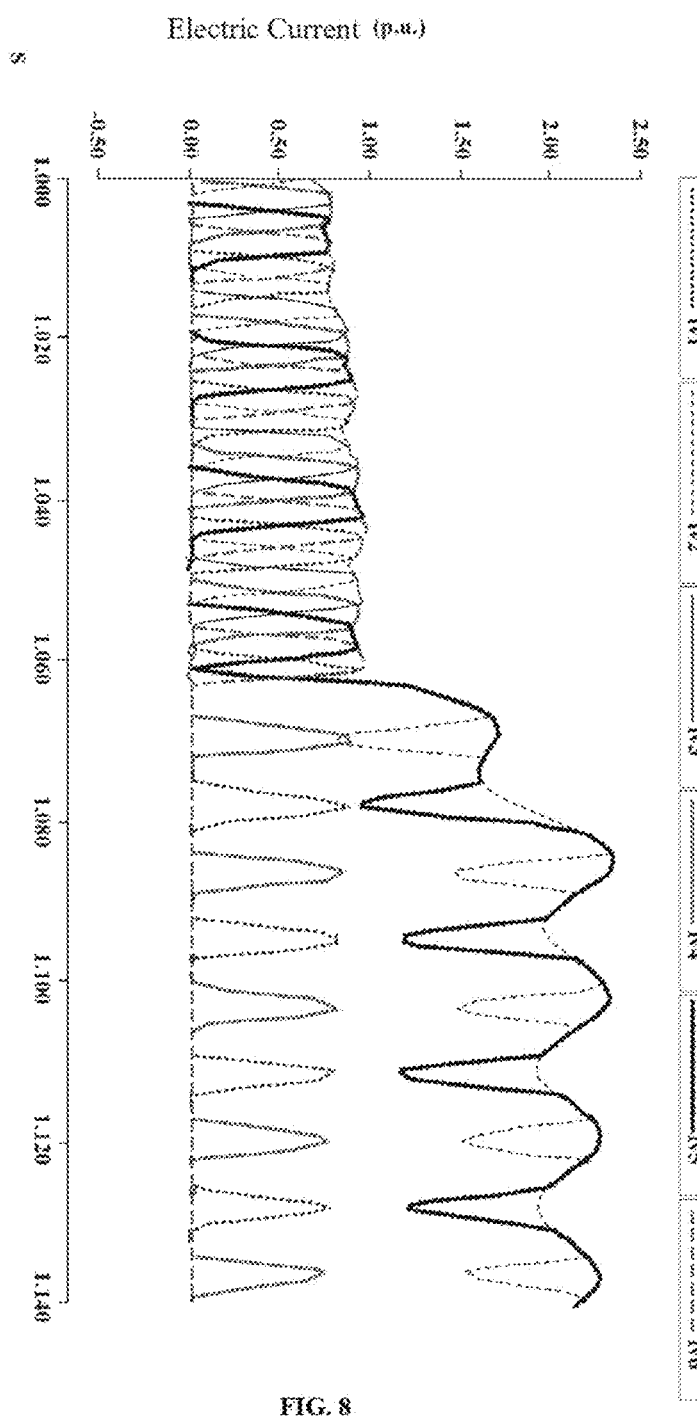
FIG. 8 shows a fault detection example of an invention embodiment caused by a biphasic fault to ground.

Referring to FIGS. 8 and 3. It simulates a biphasic short-circuit to ground in the transmission system on a 100 km transmission line, when occurring this short-circuit the thyristor (52) current (Iv1) does not complete its commutation, showing a commutation fault and thyristors (54) and (51) conduct, generating a short-circuit. At this moment the control unit (34) detects the fault and applying the present invention previously described fault detecting method it detects the fault presence generating a tripping signal (Trip) for the affected 100 km transmission line breakers. In steady state or in no-fault state, these herein described currents should be the same or its difference will be less to the given adjust of 0.05 A, so it would not exist a tripping signal, nor fault detection by the control unit (34).

Figure 9:
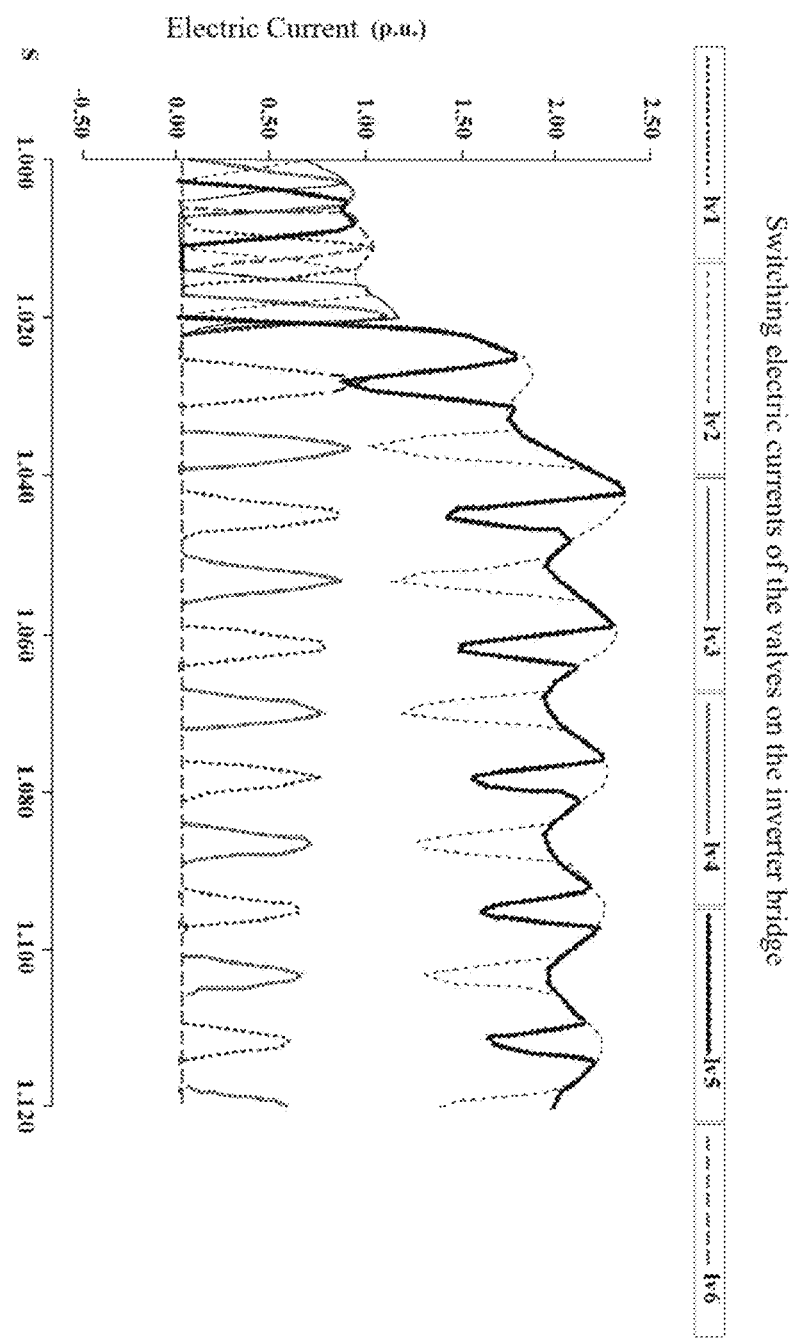
FIG. 9 shows a fault detection example of an invention embodiment caused by biphasic fault to ground in the substation with 50Ω impedance fault.

Referring to FIGS. 9 and 3. It simulates a biphasic short-circuit to ground with 50 ohm impedance in the substation, when occurring this short-circuit the thyristor (49) current signal does not complete its commutation, generating a commutation fault and thyristors (54) and (51) conduct, generating a short-circuit. At this moment the control unit (34) detects the fault and applying the present invention previously described fault detecting method it detects the fault presence generating a tripping signal (Trip) for the affected 100 km transmission line breakers. In steady state or in no-fault state, these herein described currents should be the same or its difference will be less to the given adjust of 0.05 A, so it would not exist a tripping signal, nor fault detection by the control unit (34).

Figure 10:
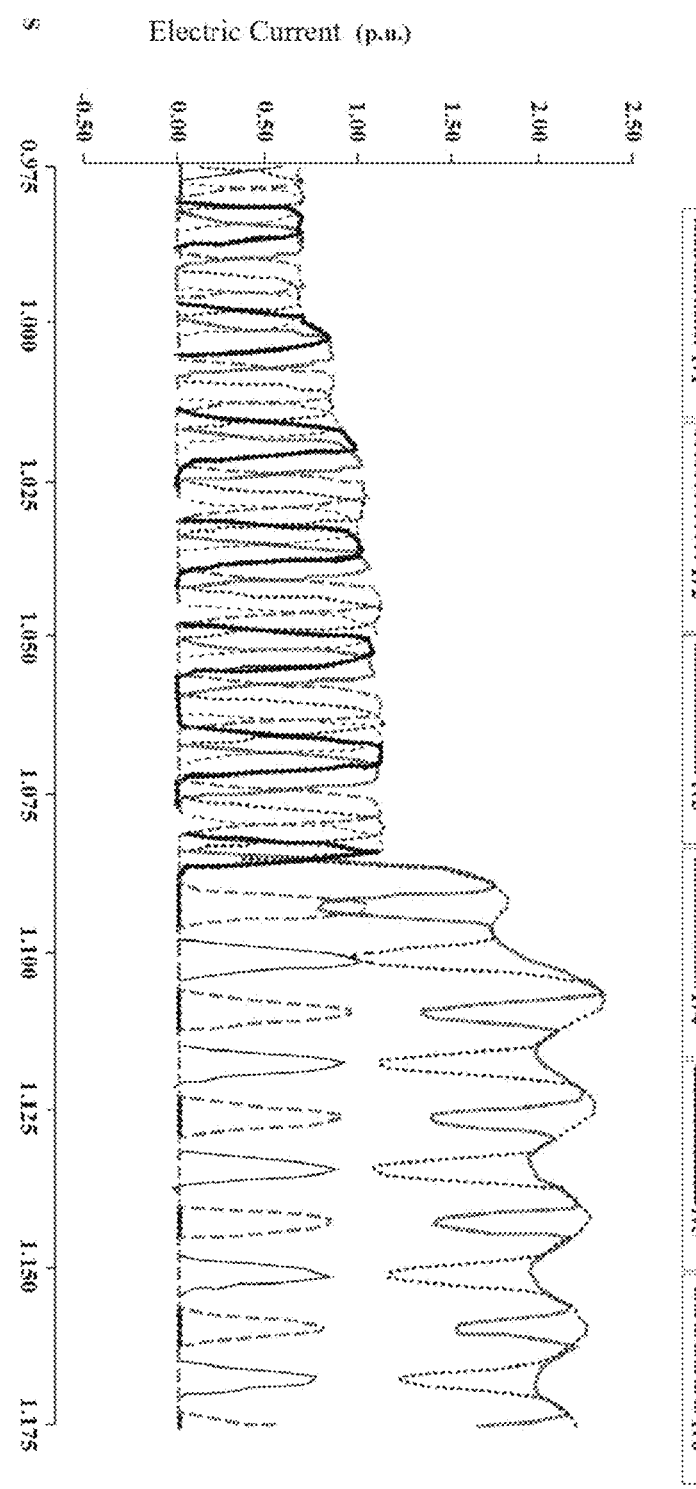
FIG. 10 shows a fault detection example of an invention embodiment caused by triphasic fault in the transmission line.

Referring to FIGS. 10 and 3. It simulates a triphasic short-circuit to ground in the transmission system on a 100 km transmission line, when occurring this short-circuit the valve 3 current signal of FIG. 1 does not complete its commutation, showing a commutation fault, the thyristors (52) and (49) conduct, generating a short-circuit. At this moment the control unit (34) detects the fault and applying the present invention previously described fault detecting method it detects the fault presence generating a tripping signal (Trip) for the affected 100 km transmission line breakers. In steady state or in no-fault state, these herein described currents should be the same or its difference will be less to the given adjust of 0.05 A, so it would not exist a tripping signal, nor fault detection by the control unit (34).

Figure 11:
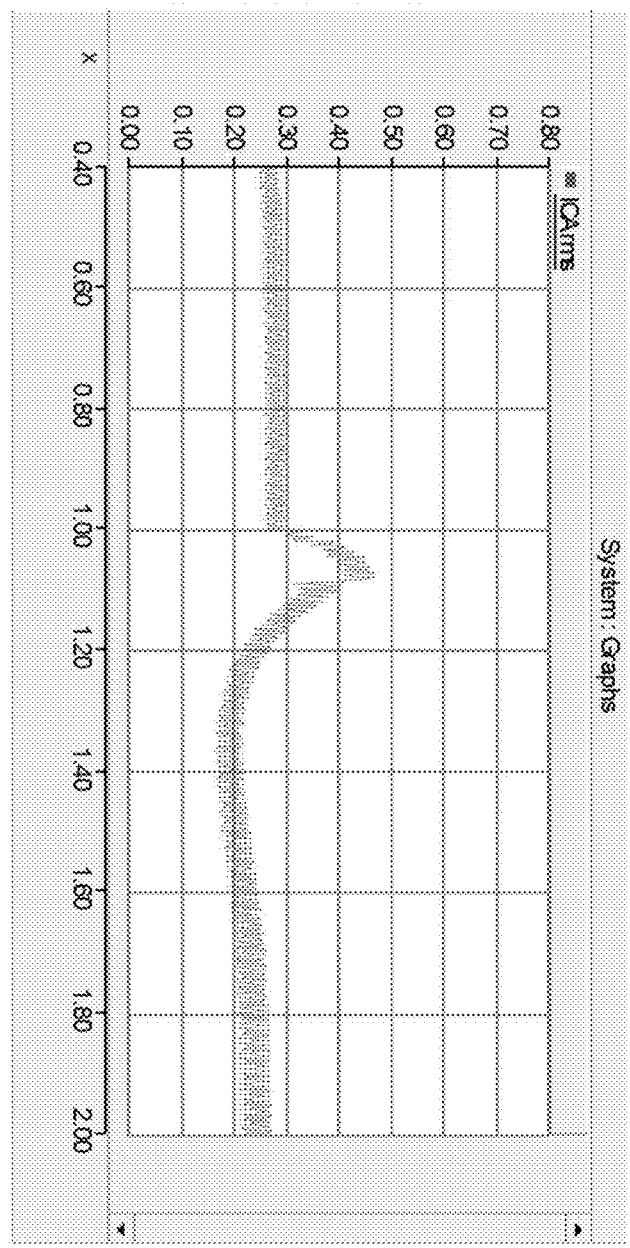
FIG. 11 shows the form of a rms current signal in the transmission and distribution system.
Figure 12:
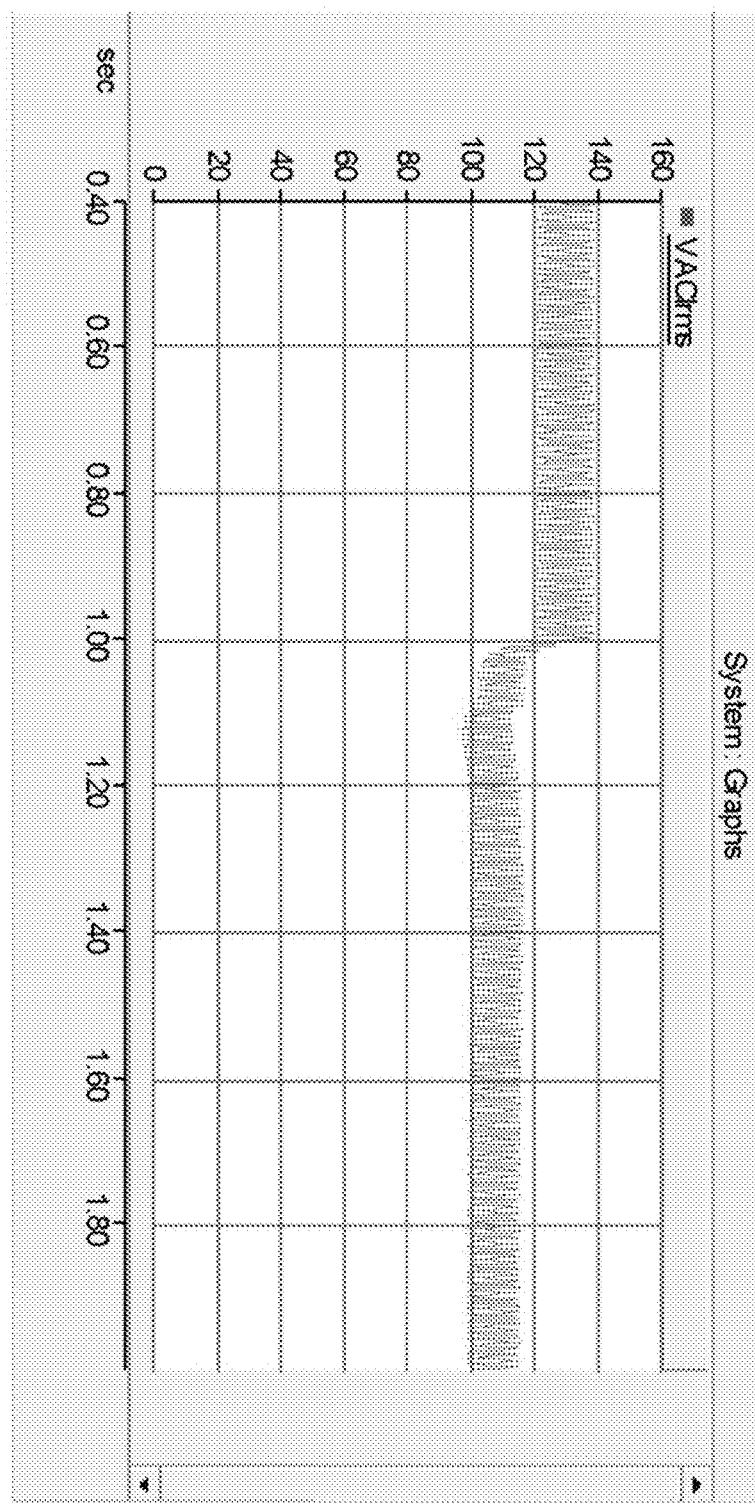
FIG. 12 shows the form of a rms tension signal in the transmission and distribution system.

E is a particular example and referring to FIG. 11. It illustrates the ac current signal form rms in a transmission system to a high impedance fault where before the first second it is observed how the current has a constant behavior, at the moment of the fault (second I), the ac current signal rms grows until the control unit (34) detects the fault and the control actions act (time 1.1 s), at this moment the fault has been identified and the ac current rms takes permissible values between 0.2 and 0.3 A.

Referring to FIG. 11. It illustrates the ac tension signal form rms in the transmission and distribution system (33) to a high impedance fault. Before the first second it is observed how the tension has a constant behavior, at the fault moment (second 1), the ace tension signal rms falls caused by the fault and continues until the control unit acts (time 1.1 s), at this moment the fault has been identified and the ac tension rms takes permissible values between 120 and 100 V.

It must be understood that the present invention is not restricted to the herein described and illustrated embodiments, since as it is evident for the skilled person in the prior art, there are possible variations and modifications that do not deviate from the invention spirit, which is only defined by the following claims.

The invention claimed is:

1. A fault detecting method in a transmission and distribution system characterized by the following steps:
   a. rectifying an AC (Alternate Current) signal of an auxiliary services three-phase system of the transmission and distribution system;
   b. rectifying, with a rectifier connected to the auxiliary services three-phase system, and inverting, with an inverter which is a three-phase thyristor converter and is connected to the rectifier, an AC signal of the transmission and distribution system;
   c. connecting the step b rectified and inverted AC signal to the step a rectified AC signal;
   d. measuring an AC current of the step b rectified and inverted AC signal;
   e. measuring a DC (Direct Current) current of the step a rectified AC signal;
   f. obtaining a value of the DC current measured in step e by a scale k factor;
   g. obtaining a Root Medium Square, RMS value of the AC current signal measured in step d;
   h. finding a difference value between the scaled and RMS values obtained in steps f and g;
   i. comparing an absolute value of the step h difference value with a reference value m; and
   j. generating a trigger signal and maintaining a DC voltage of the step b rectified and inverted AC signal between 0 and 90% of the operating voltage with no fault if the comparison made in step i is greater than the reference value m
   wherein a failure in the transmission and distribution system induces a failure in the inverter according to the principle of failure in the commutation of the thyristor.

2. The method of claim 1, wherein the AC current of the step b rectified and inverted AC signal measured in step d is rectified with a differential rectifier, subtracted from the value measured in step e and applied in steps i and j.

3. The method of claim 1, wherein in step j, the voltage of the rectified and inverted AC signal of the step b is increased between a 0 and a 3%.

4. The method of claim 1, wherein the reference value m is between 0.005 and 0.05.

5. A fault detecting apparatus in a transmission and distribution system comprising:
   a. an auxiliary services three phase system of the transmission and distribution system;
   b. a rectifier connected to the auxiliary services three phase system;
   c. an inverter which is a three-phase thyristor converter and is connected to the rectifier;
   d. the transmission and distribution system connected to the inverter through an instrumentation transformer;
   e. an electric current meter connected to the rectifier output and to the inverter output; and
   f. a control unit connected to the rectifier, the inverter and the electric current meter;
   wherein the control unit sends a firing command of the rectifier and the inverter, and compares the DC current measurement at the rectifier output with the inverter output current, sending a firing signal (firing angle) according to the comparison, so that a failure in the transmission and distribution system induces a failure in the inverter according to the principle of failure in the commutation of the thyristor.

6. The apparatus of claim 5, wherein the transmission and distribution system is connected to a differential rectifier and the control unit compares the AC current measurement of the transmission and distribution system with the DC current measurement at the rectifier output.

7. The apparatus of claim 5, wherein the rectifier is a three phase converter bridge of thyristors controlled with a firing angle of between 0° and 90°.

8. The apparatus of claim 5, wherein the inverter is a three phase converter bridge of thyristors with firing angle between 90° and 180°.

9. The apparatus of claim 5, wherein the differential rectifier is uncontrolled and constituted by diodes.

10. The apparatus of claim 5 wherein the rectifier is an uncontrolled three phase converter.

\* \* \* \* \*